Oct. 25, 1955 J. F. BYRNE ET AL 2,721,936
FREQUENCY CONVERTER
Filed March 16, 1950 4 Sheets-Sheet 1
Fig. VII
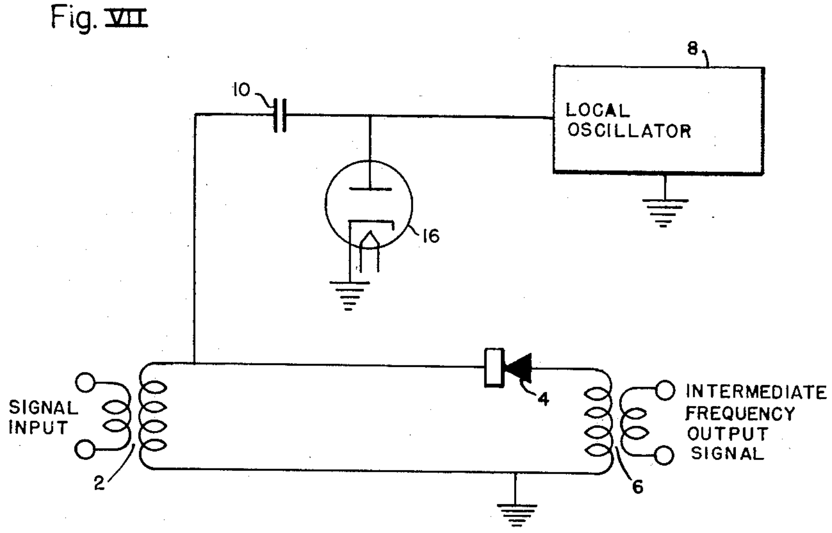
Fig. I
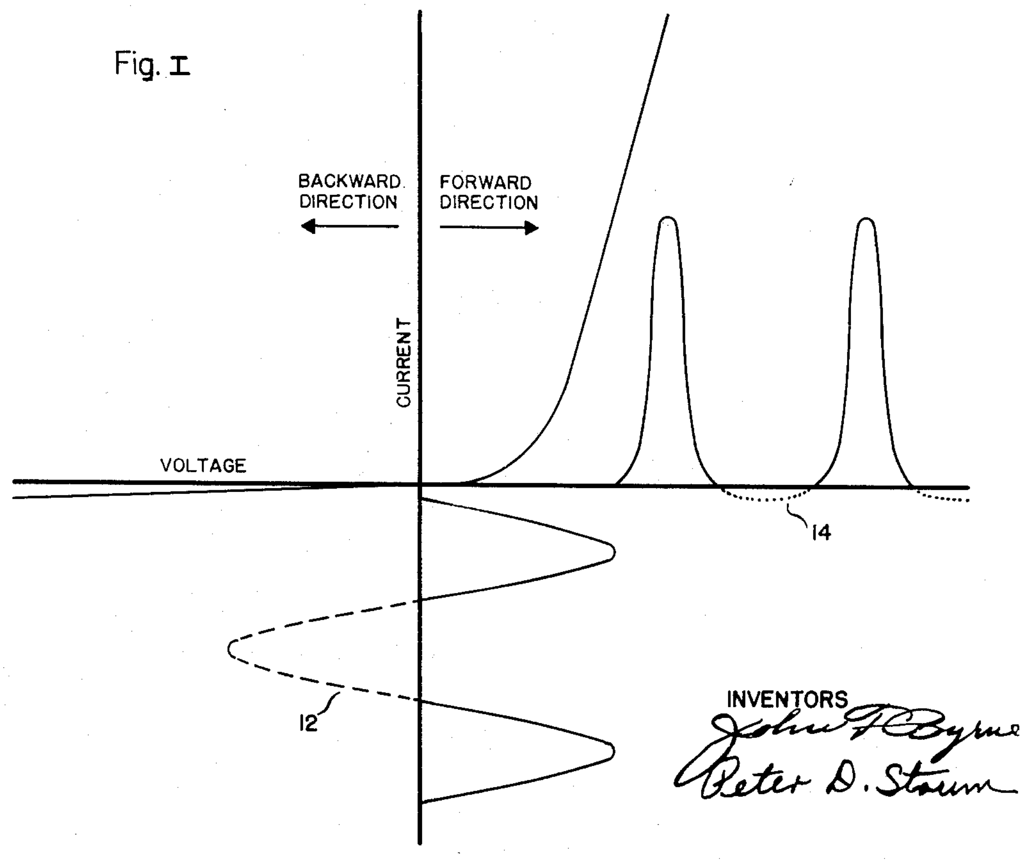
INVENTORS
John F. Byrne
Peter D. Sturm Fig. II
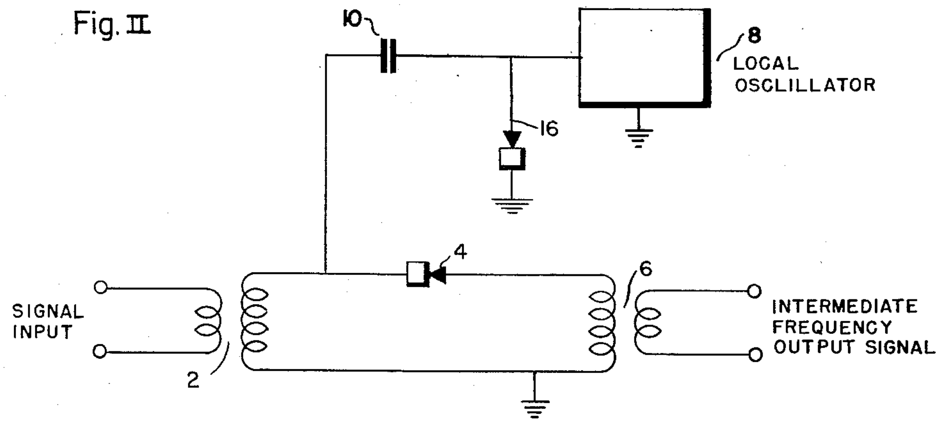
Fig. III
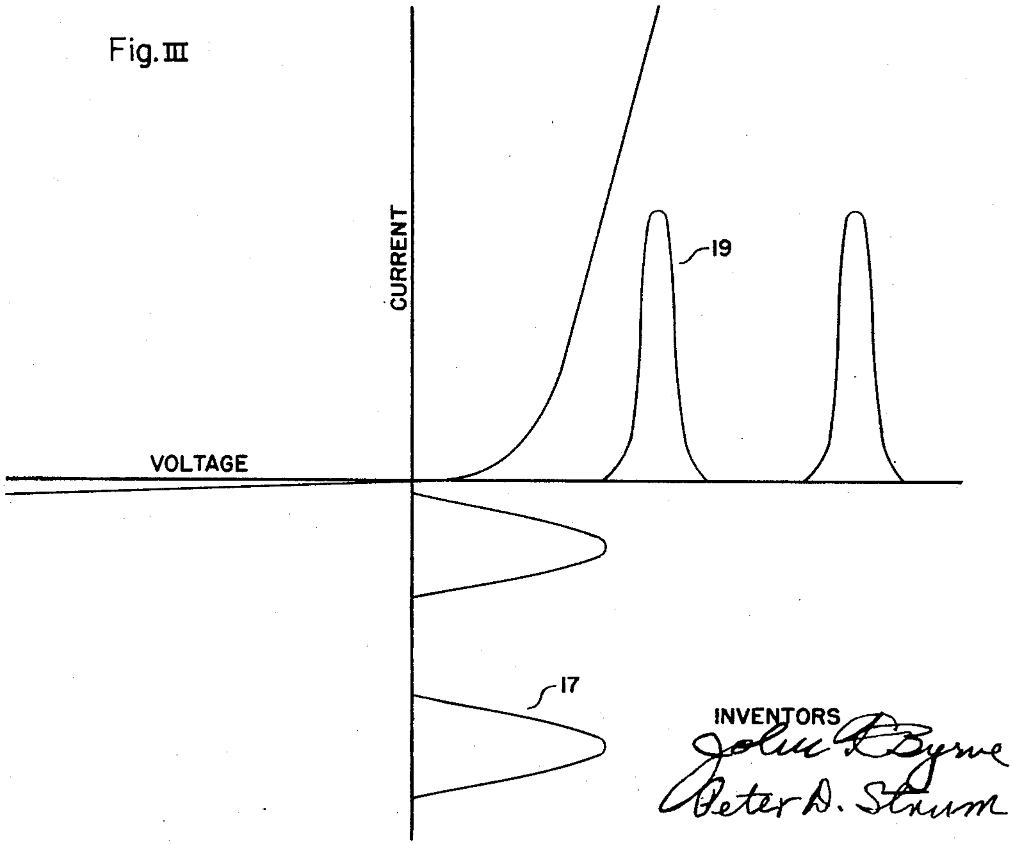
INVENTORS
John F. Byrne
Peter D. Strum Oct. 25, 1955 J. F. BYRNE ET AL 2,721,936
FREQUENCY CONVERTER
Filed March 16, 1950 4 Sheets-Sheet 3
Fig. IV
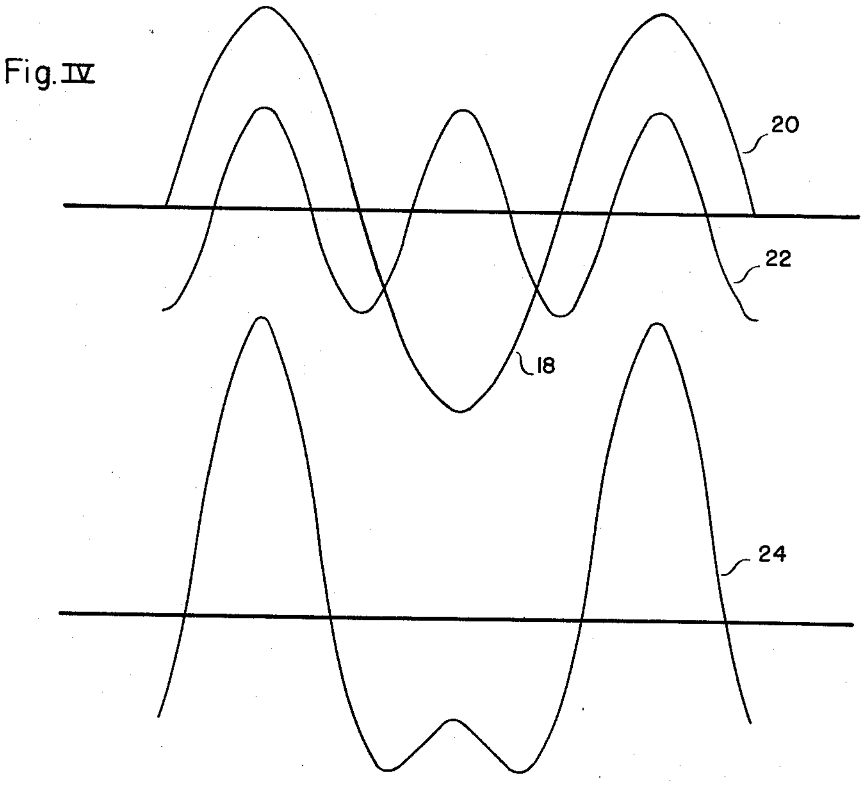
Fig. V
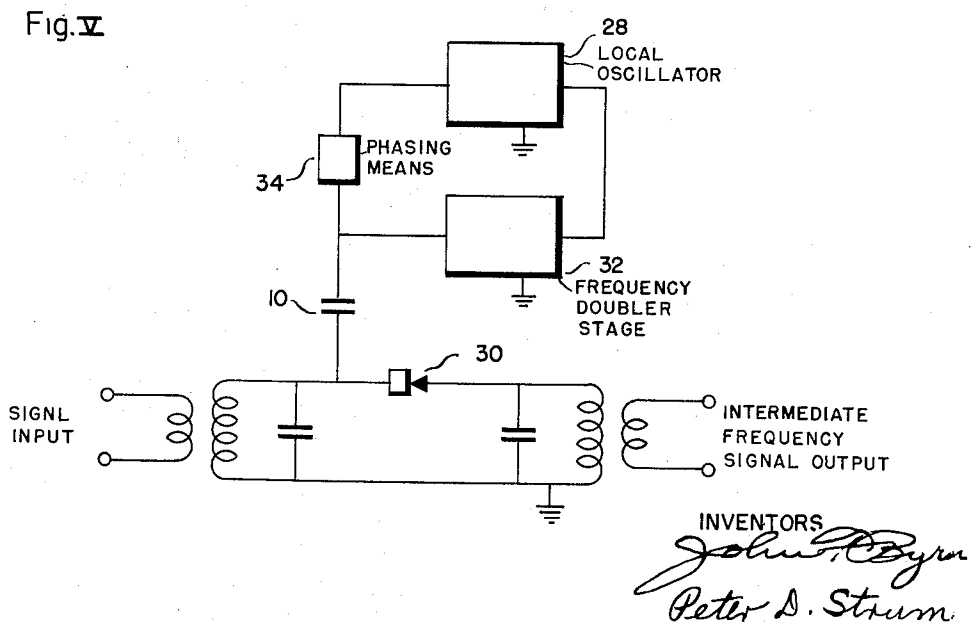
INVENTORS
John F. Byrne
Peter D. Strum Oct. 25, 1955 J. F. BYRNE ET AL 2,721,936
FREQUENCY CONVERTER
Filed March 16, 1950 4 Sheets-Sheet 4
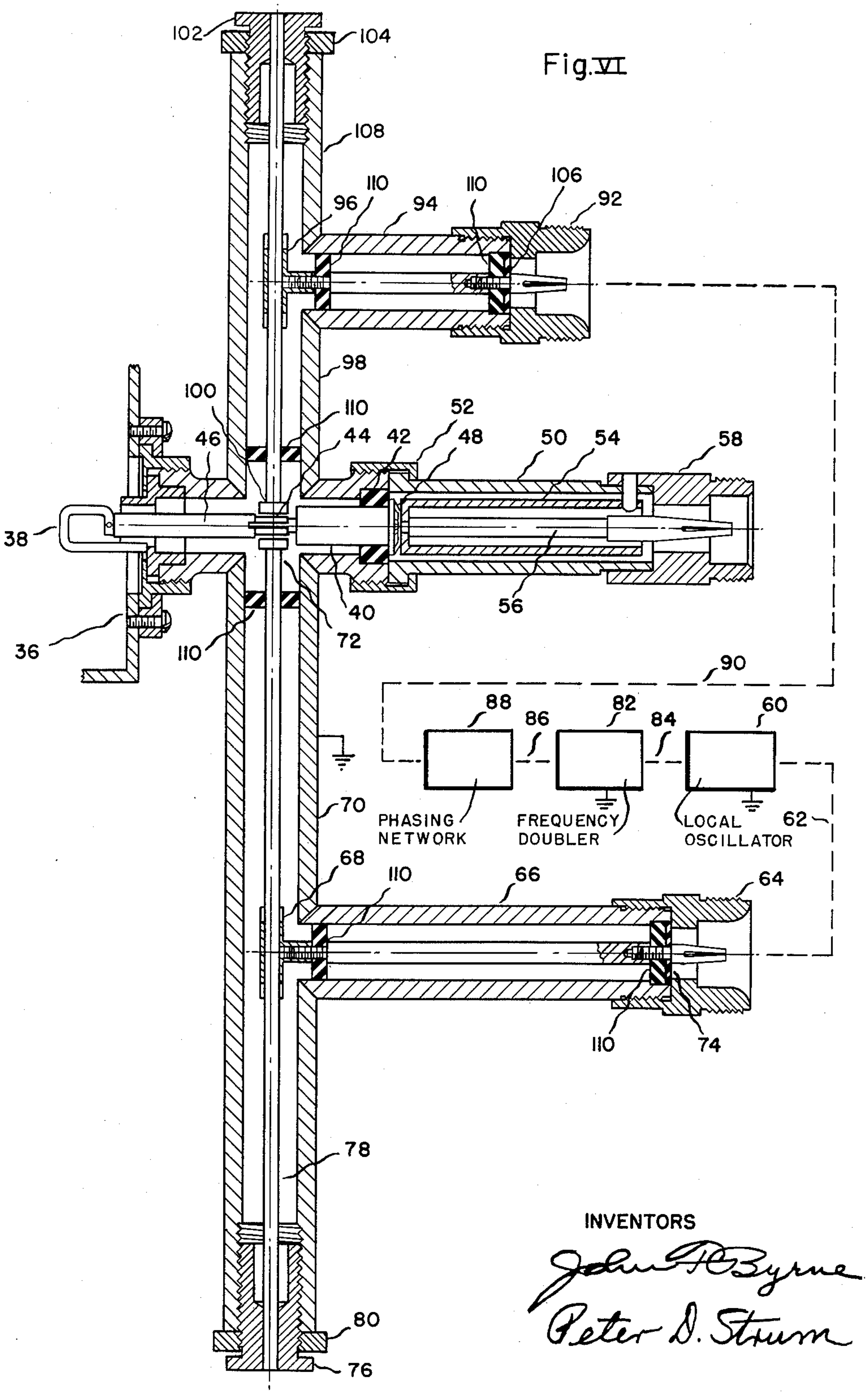
Fig. VI
INVENTORS
John F. Byrne
Peter D. Strum United States Patent Office 2,721,936

Patented Oct. 25, 1955

2,721,936

FREQUENCY CONVERTER

John F. Byrne, East Williston, and Peter D. Strum, Levittown, N. Y., assignors to Airborne Instruments Laboratory, Incorporated, Mineola, N. Y.

Application March 16, 1950, Serial No. 150,014

1 Claim. (Cl. 250—20)

This invention relates to radio apparatus and particularly to frequency converting means of the crystal mixer type.

Generally in radio communication systems the strength of the received signal is well above the level of the thermal noise, or else, in other cases external static from various sources is so high that ultimate sensitivity of the receiver is not required. However, in receiving apparatus such as that employed in radio locating or range finding of the reflected pulse or echo type, great range is desired and the noise figure of the receiver must be made as low as possible in order to permit the use of highly sensitive circuits. Superheterodyne circuits are commonly utilized in such receivers.

In most superheterodyne receivers, the received signal is heterodyned with a large signal from a local oscillator and the difference frequency amplified by the I. F. amplifiers. As is well known, if two signals of different frequencies are applied to a circuit having a non-linear resistance characteristic, a mixing action will occur and the output will contain components having the same frequencies as the two input signals, components having frequencies equal to the sum and difference of the two input frequencies and possible higher order components.

At ultra high frequencies it has been found desirable to utilize a non-linear element from one of a class of semiconducting materials such as silicon, germanium or galena, generally known as crystals, whose surface or barrier layers between the metal contact and the crystal body exhibit a non-linear resistance to the flow of current. In general, the resistance to the flow of current in one direction is much greater than to the flow of current in the opposite direction. If an alternating current is applied across the terminals, a rectifying action will occur. The resistance in the front direction decreases rapidly as the applied voltage is increased. The back resistance is normally very great for small applied voltages and remains relatively large up to moderately large back voltages. However, the relatively small back current is the source or a considerable percentage of the noise produced by such semi-conducting materials when used in mixers.

We have found that if this back current is eliminated or reduced, the noise contributed by the frequency conversion unit is greatly reduced and the sensitivity and, therefore, usable range of the receiver may be greatly increased without deleterious effects.

By crystal mixers we mean a frequency converter utilizing a non-linear element of the semi-conductor class as the conversion means.

Accordingly, it is an object of this invention to provide a method of operating circuits using crystal mixers with minimum contribution of noise by the non-linear element.

It is further an object of this invention to provide apparatus which will eliminate back current through the crystal in frequency converters utilizing such a semiconducting element.

The features of our invention which we believe to be novel are set forth with particularity in the appended claim. Our invention itself, however, both as to its organization and method of operation, together with further objects and advantages thereof, may best be understood by reference to the following description taken in connection with the accompanying drawings in which:

Figure I is a graphical presentation of the variation of current through a crystal of the silicon type, caused by varying the applied voltage.

Figure II presents diagrammatically two alternate embodiments of this invention.

Figure III is a graphical presentation of a rectified local oscillator signal applied to the curve, shown in Figure I.

Figure IV shows the wave form of the output of a typical local oscillator, the wave form of the second harmonic of the local oscillator signal and the wave form of the sum of the fundamental and second harmonic voltage wave forms when added in a particular phase relationship.

Figure V shows a diagrammatic representation of a preferred embodiment of the invention.

Figure VI represents a sectional view of a preferred embodiment of the invention.

Figure VII represents diagrammatically another embodiment of this invention.

The conventional frequency conversion apparatus of the prior art comprises a signal input coupling means, a crystal rectifier, an intermediate frequency signal output coupling means, and a local oscillator. The oscillations provided by the local oscillator, are fed to the converter through an attenuating and isolating reactive device, such as a capacitor. Reference to Figure I shows that in the arrangement of the prior art, the negative portion of the pulse, shown by dashed lines, from the local oscillator causes back current, shown by dotted lines, to flow through the crystal. Normally, the signal from the local oscillator is larger in magnitude than the received signal.

In order to eliminate this back current, one embodiment of our invention (shown in Figure II) utilizes a crystal rectifier 16, to eliminate the negative portion of the local oscillator pulse. The amplitude of the local oscillator signal is chosen in accordance with standard practice which is fully described in the literature. The balance of the circuit corresponds to the conventional mixer circuit of the prior art. This rectifier need not be of the crystal type, but may be an electron tube or other equivalent means. The rectified local oscillator, signal 17, produces mixer output signal 19 (Figure III).

A preferred embodiment of our invention (Figure IV) eliminates essentially the entire negative portion 18 of the local oscillator signal output voltage wave 20, by adding the second harmonic 22 of the local oscillator signal 20 in such phase relationship that both voltages reach maximum amplitude at the same instant which results in wave form 24. It has been found that if the amplitude of the second harmonic signal 22 is approximately one-half that of the fundamental frequency signal 20, a desirable wave shape is obtained.

In diagrammatic form there is shown in Figure V, a mixer circuit utilizing a local oscillator 28 which feeds a signal to the mixer circuit 30 and also to a frequency doubler stage 32 utilizing an electronic device, the output of which is fed through a phasing means 34 to the converter circuit 30. The phasing means 34 may be located at any convenient point in this circuit where it can control the relative phase between the local oscillator output and the output from the frequency doubler stage.

A preferred embodiment of our invention utilizing coaxial lines is shown in section in Figure VI. The signal energy is conducted through a resonant cavity indicated at 36 by a coupling loop 38 and is fed to the mixer crystal 40 through a coaxial line 46. The configuration of the coupling loop 38 was experimentally determined so as to obtain the maximum transfer of available signal energy from the resonant cavity. This in turn results in a minimum noise figure for the system. The crystal 40 is mounted in a polystyrene ring 42 and its tip is gripped by spring prongs 44 forming the tip of inner conductor of coaxial line 46. By means of a spring 48, the other terminal of the crystal 40 is kept in electrical contact against an intermediate frequency filter assembly 50 which is removable to facilitate insertion or replacement of the crystal by means of locking ring 52. The filter 50 contains a folded open circuited transmission line 54, of low characteristic impedance which is one-quarter wavelength long at the signal frequency. The open circuited transmission line 54 consists of a closed cylinder shorted at one end to the inner conductor 56 of filter 50. This effectively grounds the output end of the crystal for the signal and the local oscillator fundamental and second harmonic frequencies, while preserving a minimum capacitance across the intermediate frequency output terminals. The filter cavity has pieces of polystyrene inserted in order to reduce its physical length by loading. The intermediate frequency is now fed through a connector 58 to the intermediate frequency circuits.

The signal from the local oscillator 60, is coupled to the mixer crystal 40 through coaxial cable 62, coupling 64, coaxial line 66, sliding contact junction 68, coaxial line 70 and capacitive probe 72.

The coaxial cable 62 is terminated in disk resistor 74 whose resistance in ohms is the characteristic impedance of the line. The combined length of the signal path from disk resistor 74 to the mixer crystal 40 is one-half wavelength of the oscillator frequency.

The degree of coupling is varied by turning the adjustment screw 76, which moves inner conductor 78 to which the probe 72 is attached. In order to preserve a minimum of reactance mismatch to the local oscillator, the local oscillator drive adjustment screw 76 is located about one-quarter wavelength from the sliding junction 68. It therefore presents a very high impedance at the junction and causes negligible loss of load oscillation energy. A knurled locking nut 80 is provided in order to lock the adjustment screw 76 in position.

A portion of the signal output from local oscillator 60 is fed to frequency doubler 82 through coaxial cable 84. The resultant second harmonic frequency signal is fed through a coaxial cable 86 to a phasing network 88, which controls the relative phase relationship between the local oscillator signal supplied to the mixer crystal and the signal from frequency doubler 82. The signal is then transmitted through coaxial cable 90 to coupling 92, coaxial line 94, sliding junction 96, coaxial line 98 and capacitive probe 100 to mixer crystal 40. Probe adjusting screw 102 and lock nut 104 control the degree of coupling.

From the disk resistor 106 to the mixer crystal, the path is one-half the wavelength and the shorted stub element 108 is one-fourth the wavelength of the second harmonic signal. Polystyrene rings 110 are used to support the inner conductor of the coaxial lines. It is preferable that the metal surfaces be plated with a metal such as gold or silver so as to provide a noncorrosive highly conductive surface.

Although we have illustrated our invention as embodied in a superheterodyne receiver, other applications will readily be apparent to those skilled in the art. We do not, therefore, desire our invention to be limited to the particular circuit arrangement shown and described, and we intend in the appended claim to cover all modifications within the true spirit and scope of our invention.

What we claim as new and desire to secure by Letters Patent of the United States is:

A mixer system for producing heterodyne signals from two input signals of different frequencies, comprising: a mixer crystal, a frequency multiplier, means for applying a first one of said input signals to said mixer crystal, means for applying a second one of said input signals to said mixer crystal, means for applying a portion of the second of said input signals to said frequency multiplier, means for applying the second harmonic output of said frequency multiplier to said mixer crystal, means for adjusting the phase relationship between the said second one of said input signals and the said second harmonic signal so that their respective voltage maximum points coincide and means for removing the resulting heterodyned signal.

References Cited in the file of this patent

UNITED STATES PATENTS

| | | |
|---|---|---|
| 1,674,696 | Ohl | June 26, 1928 |
| 1,753,445 | Ohl | Apr. 8, 1930 |
| 1,793,959 | Powell | Feb. 24, 1931 |
| 2,114,840 | Hamacher | Apr. 19, 1938 |
| 2,433,387 | Mumford | Dec. 30, 1947 |
| 2,436,830 | Sharpless | Mar. 2, 1948 |
| 2,455,657 | Cork et al. | Dec. 7, 1948 |
| 2,617,016 | Knol et al. | Nov. 4, 1952 |

OTHER REFERENCES

"Microwave Converters," by C. F. Edwards, Proc. I. R. E. vol. 35, pages 1181–1191, November 1947.